(12) United States Patent
Robeson et al.

(10) Patent No.: US 11,135,766 B2
(45) Date of Patent: Oct. 5, 2021

(54) PRODUCTS CONTAINING NYLON 6 PRODUCED BY STEREOLITHOGRAPHY AND METHODS OF MAKING THE SAME

(71) Applicant: Carbon, Inc., Redwood City, CA (US)

(72) Inventors: Lloyd M. Robeson, Macungie, PA (US); Jason P. Rolland, San Carlos, CA (US)

(73) Assignee: Carbon, Inc., Redwood City, CA (US)

( * ) Notice: Subject to any disclaimer, the term of this patent is extended or adjusted under 35 U.S.C. 154(b) by 454 days.

(21) Appl. No.: 16/014,786

(22) Filed: Jun. 21, 2018

(65) Prior Publication Data

US 2019/0001553 A1 Jan. 3, 2019

Related U.S. Application Data

(60) Provisional application No. 62/526,663, filed on Jun. 29, 2017.

(51) Int. Cl.

| | |
|---|---|
| *B29C 64/135* | (2017.01) |
| *B29C 64/40* | (2017.01) |
| *C08K 5/00* | (2006.01) |
| *G03F 7/00* | (2006.01) |
| *C09D 175/08* | (2006.01) |
| *B29C 35/08* | (2006.01) |
| *B29C 64/124* | (2017.01) |
| *C08G 18/67* | (2006.01) |
| *B33Y 10/00* | (2015.01) |
| *G03F 7/20* | (2006.01) |
| *C08J 3/24* | (2006.01) |
| *C08G 69/18* | (2006.01) |
| *G03F 7/38* | (2006.01) |
| *B33Y 70/00* | (2020.01) |
| *C08G 18/48* | (2006.01) |
| *G03F 7/027* | (2006.01) |
| *B29K 77/00* | (2006.01) |

(52) U.S. Cl.
CPC ........ *B29C 64/135* (2017.08); *B29C 35/0805* (2013.01); *B29C 64/124* (2017.08); *B29C 64/40* (2017.08); *B33Y 10/00* (2014.12); *B33Y 70/00* (2014.12); *C08G 18/4854* (2013.01); *C08G 18/672* (2013.01); *C08G 69/18* (2013.01); *C08J 3/246* (2013.01); *C08K 5/0008* (2013.01); *C09D 175/08* (2013.01); *G03F 7/0037* (2013.01); *G03F 7/027* (2013.01); *G03F 7/2012* (2013.01); *G03F 7/38* (2013.01); *B29K 2077/00* (2013.01); *C08J 2377/02* (2013.01)

(58) Field of Classification Search
CPC ...... B29C 64/135; B29C 64/129; B29C 64/40
See application file for complete search history.

(56) References Cited

U.S. PATENT DOCUMENTS

| | | |
|---|---|---|
| 3,213,058 A | 10/1965 | Boyle et al. |
| 3,366,608 A | 1/1968 | Lincoln et al. |
| 3,694,389 A | 9/1972 | Levy |
| 4,785,075 A | 11/1988 | Shimp |
| 5,236,637 A | 8/1993 | Hull |
| 5,391,072 A | 2/1995 | Lawton et al. |
| 5,529,473 A | 6/1996 | Lawton et al. |
| 6,861,475 B2 | 3/2005 | Ilenda et al. |
| 6,894,113 B2 | 5/2005 | Court et al. |
| 6,916,867 B2 | 7/2005 | Gugumus |
| 7,157,586 B2 | 1/2007 | Wood et al. |
| 7,438,846 B2 | 10/2008 | John |
| 7,625,977 B2 | 12/2009 | Lutz et al. |
| 7,642,316 B2 | 1/2010 | Rego et al. |
| 7,649,029 B2 | 1/2010 | Kolb et al. |
| 7,695,643 B2 | 4/2010 | Fritzsche et al. |
| 7,767,728 B2 | 8/2010 | Lu et al. |
| 7,820,760 B2 | 10/2010 | Pham et al. |
| 7,892,474 B2 | 2/2011 | Shkolnik et al. |
| 7,935,476 B2 | 5/2011 | Teng |
| 8,088,245 B2 | 1/2012 | Lutz et al. |
| 8,110,135 B2 | 2/2012 | El-Siblani |
| 8,119,214 B2 | 2/2012 | Schwantes et al. |

(Continued)

FOREIGN PATENT DOCUMENTS

| | | |
|---|---|---|
| CN | 102715751 | 10/2012 |
| EP | 1632533 | 3/2006 |

(Continued)

OTHER PUBLICATIONS

Janusziewcz et al. "Layerless fabrication with continuous liquid interface production" Proceedings of the National Academy of Sciences USA, 113(42): 11703-11708 (2016).

Tumbleston et al. "Continuous liquid interface production of 3D objects" Science, 347(6228): 1349-1352 (2015).

*Primary Examiner* — Jacob T Minskey
*Assistant Examiner* — Virak Nguon
(74) *Attorney, Agent, or Firm* — Myers Bigel, P.A.

(57) ABSTRACT

Provided herein according to some embodiments is a method of forming a three-dimensional object comprising nylon 6 by additive manufacturing, as well as objects so produced. Also provided is a polymerizable liquid composition useful for producing a three-dimensional object comprising nylon 6 by additive manufacturing, which composition may include: (a) a light polymerizable first component, and (b) a heat polymerizable second component; said heat polymerizable second component comprising: (i) caprolactam monomers, (ii) a catalyst for anionic polymerization of caprolactam, and (iii) an initiator for anionic polymerization of caprolactam.

24 Claims, No Drawings

(56) References Cited

U.S. PATENT DOCUMENTS

| | | |
|---|---|---|
| 8,232,043 B2 | 7/2012 | Williamson et al. |
| 9,205,601 B2 | 12/2015 | Desimone et al. |
| 9,211,678 B2 | 12/2015 | Desimone et al. |
| 9,216,546 B2 | 12/2015 | Desimone et al. |
| 9,453,142 B2 | 9/2016 | Rolland et al. |
| 9,598,606 B2 | 3/2017 | Rolland et al. |
| 9,676,963 B2 | 6/2017 | Rolland et al. |
| 9,982,164 B2 | 5/2018 | Rolland et al. |
| 2002/0113331 A1* | 8/2002 | Zhang .................. B29C 41/003 264/40.1 |
| 2007/0027233 A1 | 2/2007 | Yamaguchi et al. |
| 2010/0280151 A1 | 11/2010 | Nguyen et al. |
| 2013/0292862 A1 | 11/2013 | Joyce |
| 2013/0295212 A1 | 11/2013 | Chen et al. |
| 2015/0215430 A1 | 7/2015 | Votour |
| 2015/0240113 A1 | 8/2015 | Pratt et al. |
| 2016/0136889 A1* | 5/2016 | Rolland ............. C08G 18/8175 264/1.27 |
| 2016/0137838 A1 | 5/2016 | Rolland et al. |
| 2016/0160077 A1 | 6/2016 | Rolland et al. |
| 2017/0355857 A1* | 12/2017 | Lee ....................... B29C 64/135 |
| 2018/0029291 A1* | 2/2018 | Matzner ................. B33Y 10/00 |
| 2019/0176387 A1* | 6/2019 | Kuno .................... B29C 64/393 |

FOREIGN PATENT DOCUMENTS

| | | |
|---|---|---|
| EP | 2123711 | 11/2009 |
| JP | 2012210408 | 11/2012 |
| WO | 2012/129968 | 10/2012 |
| WO | 2015/164234 | 10/2015 |
| WO | 2016/133759 | 8/2016 |
| WO | 2016/145182 | 9/2016 |

* cited by examiner

PRODUCTS CONTAINING NYLON 6 PRODUCED BY STEREOLITHOGRAPHY AND METHODS OF MAKING THE SAME

BACKGROUND

The emergence of 3-dimensional (3D) fabrication processes for polymeric materials has resulted in an industry offering a unique method for fabrication of viable articles of commerce. These methods involve various processes including laser sintering of polymeric powders, fused deposition molding of extruded threads of thermoplastic polymers, and various UV curing processes employing vinylic monomers.

Unfortunately, additive manufacturing techniques have generally been slow, and have long been known to produce parts with a limited range of mechanical properties, frequently rendering such products unsuitable for real world use beyond simple prototyping.

A process for UV curing of monomers offering unique advantages over other 3D fabrication methods including other UV curing processes has been termed CLIP (continuous liquid interface production). These techniques enable the rapid production of three-dimensional objects in a layerless manner, by which the parts may have desirable structural and mechanical properties. See, e.g., J. DeSimone et al., U.S. Pat. Nos. 9,211,678, 9,205,601, and 9,216,546; J. Tumbleston, et al., *Continuous liquid interface production of 3D Objects, Science* 347, 1349-1352 (2015); and R. Janusziewcz et al., Layerless fabrication with continuous liquid interface production, *Proc. Natl. Acad. Sci. USA* 113, 11703-11708 (2016).

The speed, and other attributes, of CLIP is complimented by the development of "dual cure" stereolithography resins, in which the shape of an article is created by light polymerization in the additive manufacturing process, and the mechanical properties of the article are created in a second cure that typically follows (for example, by baking). Dual cure resins that provide for a range of mechanical properties in the final product are described in, for example, J. Rolland et al., U.S. Pat. Nos. 9,453,142, 9,598,606, 9,676,963, 9,982,164, and U.S. Patent Application Publication No. 2016/0160077.

However, additional compositions useful for making three-dimensional objects by UV curing are still needed. For example, polyamides like nylon 6 can be employed in laser sintering and fused deposition molding processes, but they have not been realized in UV curable processes. It is desirable to polymerize the nylon 6 monomer (ε-caprolactam) in a 3D stereolithography fabrication process such as CLIP.

SUMMARY

Provided herein according to some embodiments is a method of forming a three-dimensional object comprising nylon 6, said method comprising one or more of the steps of: (a) providing a carrier and an optically transparent member having a build surface, said carrier and said build surface defining a build region therebetween; (b) filling said build region with a polymerizable liquid, said polymerizable liquid comprising a mixture of (i) a light polymerizable first component, and (ii) a heat polymerizable second component; said heat polymerizable second component comprising (i) caprolactam monomers, (ii) a catalyst for anionic polymerization of caprolactam, and (iii) an initiator for anionic polymerization of caprolactam; (c) irradiating said build region with light through said optically transparent member to form a solid polymer scaffold from said first component and also advancing said carrier and said build surface away from one another to form a three-dimensional intermediate having the same shape as, or a shape to be imparted to, said three-dimensional object, with said three-dimensional intermediate containing said heat polymerizable second component in unpolymerized form; and then (d) heating said three-dimensional intermediate and polymerizing said caprolactam to form said three-dimensional object comprising nylon 6.

In some embodiments, the catalyst for anionic polymerization of caprolactam comprises an alkali metal or alkaline earth metal complexed caprolactam, an alkali metal, a metal hydride, a metal amide or an organometallic material such as sodium naphthalene. In some embodiments, the catalyst for anionic polymerization of caprolactam comprises sodium caprolactam.

In some embodiments, the initiator for anionic polymerization of caprolactam comprises N-acetyl caprolactam, a bislactam such as N,N'-adipoyl-bis-caprolactam, a bischloroformate such as the bischloroformate of dihydroxy poly(tetramethylene glycol), 4,4'-dichlorodiphenylsulfone, 4,4'-difluorodiphenylsulfone, acetic anhydride, or an isocyanate.

In some embodiments, the initiator for anionic polymerization of caprolactam comprises an isocyanate, said isocyanate is provided as a blocked isocyanate (e.g., a reactive blocked isocyanate and/or a volatile blocked isocyanate), and said heating of step (d) is sufficient to deblock said blocked isocyanate, thus forming said initiator for anionic polymerization of caprolactam.

In some embodiments, the polymerizable liquid is anhydrous (e.g., less than 1000 parts per million of water by weight of the composition). In some embodiments, the irradiating/advancing and/or heating steps are carried out under anhydrous conditions (e.g., under a blanket of nitrogen).

In some embodiments, the three-dimensional object comprises a polymer blend, interpenetrating polymer network, semi-interpenetrating polymer network, or sequential interpenetrating polymer network formed from said first component and said second component.

In some embodiments, the heating is carried out to a temperature that is below the melting point of nylon 6 (e.g., from 80° C. to 150° C.).

In some embodiments, the light polymerizable first component comprises a blocked isocyanate that is blocked with a light reactive blocking group (e.g., ABPU); and the heating step (d) is carried out under conditions in which at least a portion of the solid polymer scaffold produced by light polymerization of the first component degrades and forms an isocyanate initiator that participates in heat polymerizing of caprolactam to form said three-dimensional object comprising nylon 6. In some embodiments, the reactive blocked isocyanate comprises two or more ethylenically unsaturated end groups.

In some embodiments, the irradiating and/or said advancing steps are carried out while also concurrently: (i) continuously maintaining a dead zone of polymerizable liquid in contact with said build surface, and (ii) continuously maintaining a gradient of polymerization zone between said dead zone and said solid polymer scaffold and in contact with each thereof, said gradient of polymerization zone comprising said first component in partially cured form.

In some embodiments, the optically transparent member comprises a semipermeable member, and said continuously maintaining a dead zone is carried out by feeding an inhibitor of polymerization through said optically transparent member, thereby creating a gradient of inhibitor in said dead zone and optionally in at least a portion of said gradient of polymerization zone. In some embodiments, the optically transparent member comprises a fluoropolymer.

In some embodiments, the first component comprises a free radical polymerizable liquid and the inhibitor comprises oxygen.

Also provided is a three-dimensional object comprising nylon 6 produced by a method as provided herein. In some embodiments, the object is selected from the group consisting of: gears, bushings, sprockets, valves, seals, tool housings, chain guides, slides, glides, and complex electronic parts.

Further provided is a polymerizable liquid composition useful for producing a three-dimensional object comprising nylon 6 by additive manufacturing, comprising: (a) a light polymerizable first component, and (b) a heat polymerizable second component; said heat polymerizable second component comprising: (i) caprolactam monomers, (ii) a catalyst for anionic polymerization of caprolactam, and (iii) an initiator for anionic polymerization of caprolactam.

In some embodiments, the catalyst for anionic polymerization of caprolactam comprises an alkali metal or alkaline earth metal complexed caprolactam, an alkali metal, a metal hydride, a metal amide or an organometallic material such as sodium naphthalene. In some embodiments, the catalyst for anionic polymerization of caprolactam comprises sodium caprolactam.

In some embodiments, the initiator for anionic polymerization of caprolactam comprises N-acetyl caprolactam, a bislactam such as N,N'-adipoyl-bis-caprolactam, a bischloroformate such as the bischloroformate of dihydroxy poly(tetramethylene glycol), 4,4'-dichlorodiphenylsulfone, 4,4'-difluorodiphenylsulfone, acetic anhydride, or an isocyanate.

In some embodiments, the initiator for anionic polymerization of caprolactam comprises an isocyanate, and said isocyanate is provided as a blocked isocyanate (e.g., a reactive blocked isocyanate and/or a volatile blocked isocyanate).

In some embodiments, the polymerizable liquid composition is anhydrous (e.g., less than 1000 parts per million of water by weight of the composition).

In some embodiments, the light polymerizable first component comprises a blocked isocyanate that is blocked with a light reactive blocking group (e.g., ABPU); and the heating step (d) is carried out under conditions in which at least a portion of the solid polymer scaffold produced by light polymerization of the first component degrades and forms an isocyanate initiator that participates in heat polymerizing of caprolactam to form said three-dimensional object comprising nylon 6. In some embodiments, the reactive blocked isocyanate comprises two or more ethylenically unsaturated end groups.

In some embodiments, the polymerizable liquid may further may further include at least one photoinitiator (e.g., in an amount of from 0.1 to 1 or 5 percent by weight), at least one dye (e.g., in an amount of 0.001 or 0.01 to 1 or 5 percent by weight), and/or at least one filler (e.g., in an amount of 0.01 or 0.1 to 20 or 50 percent by weight).

DETAILED DESCRIPTION

The present disclosure provides compositions and methods useful for creating nylon-6 containing objects by additive manufacturing such as stereolithography and related processes such as Continuous Liquid Interface Production (CLIP), as well as products so produced.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations of one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present invention. The sequence of operations (or steps) is not limited to the order presented in the claims or figures unless specifically indicated otherwise.

Dual cure stereolithography resins suitable for stereolithography techniques (particularly for CLIP) are described in J. Rolland et al., PCT Applications PCT/US2015/036893 (see also U.S. Patent Application Pub. No. US 2016/0136889), PCT/US2015/036902 (see also U.S. Patent Application Pub. No. US 2016/0137838), PCT/US2015/036924 (see also U.S. Patent Application Pub. No. US 2016/016077), and PCT/US2015/036946 (see also U.S. Pat. No. 9,453,142). These resins usually include a first polymerizable system, typically polymerized by light (sometimes referred to as "Part A"), from which an intermediate object is produced, and also include at least a second polymerizable system ("Part B") which is usually cured after an intermediate object is first formed, and which imparts desirable structural and/or tensile properties to the final object.

I. Part A—UV Polymerizable Liquids

Dual cure systems as described herein may include a first curable system (sometimes referred to as "Part A" herein) that is curable by actinic radiation, typically light, and in some embodiments ultraviolet (UV) light. Any suitable polymerizable liquid can be used as the first component. The liquid (sometimes also referred to as "liquid resin," "ink," or simply "resin" herein) can include monomers, particularly photopolymerizable and/or free radical polymerizable monomers, and a suitable initiator such as a free radical initiator, and combinations thereof. Examples include, but are not limited to, acrylics, methacrylics, acrylamides, styrenics, olefins, halogenated olefins, cyclic alkenes, maleic anhydride, alkenes, alkynes, carbon monoxide, functionalized oligomers, multifunctional cute site monomers, functionalized PEGs, etc., including combinations thereof. Examples of liquid resins, monomers and initiators include but are not limited to those set forth in U.S. Pat. Nos. 8,232,043; 8,119,214; 7,935,476; 7,767,728; 7,649,029; WO 2012129968 A1; CN 102715751 A; JP 2012210408 A. In some embodiments, the resin may include agents to enhance the free radical polymerization, such as Lewis acids, peroxides, etc.

In some embodiments, the Part A reactants comprise vinylic monomers capable of UV polymerization, including, but not limited to, (meth)acrylate monomers such as isobornyl methacrylate, isobornyl acrylate, ethyl methacrylate, methyl methacrylate, 2-ethyl hexyl acrylate, n-butyl acrylate, n-butyl methacrylate, and the like. Additional vinylic monomers may include styrene, substituted styrenes, N-vinyl pyrrolidone, vinyl acetate, N-vinyl formamide, maleic anhydride, acrylamides and the like. In some embodiments, UV polymerizable di- tri- and polyfunctional vinyl compounds can be used such as trimethyol propane triacrylate to crosslink the vinyl polymer network to provide form stability for the second stage polymerization.

In some embodiments, a blocked urethane capable of deblocking to yield an isocyanate, with the deblocking group comprising a vinyl group, can be provided for the Part A polymerization. That is, light polymerizable ("reactive") blocking groups may be used to block the otherwise reactive isocyanate ("NCO") groups of a monomer or prepolymer to create a light polymerizable constituent (see Scheme 1), which blocking groups subsequently degrade on heating to unmask the NCO group so that it can participate in a subsequent cure (e.g., upon baking) as an initiator of anionic polymerization of caprolactam to produce a nylon 6 polymer as taught herein for the finished object.

Scheme 1. Synthesis of a reactive blocked polyurethane/polyurea prepolymer

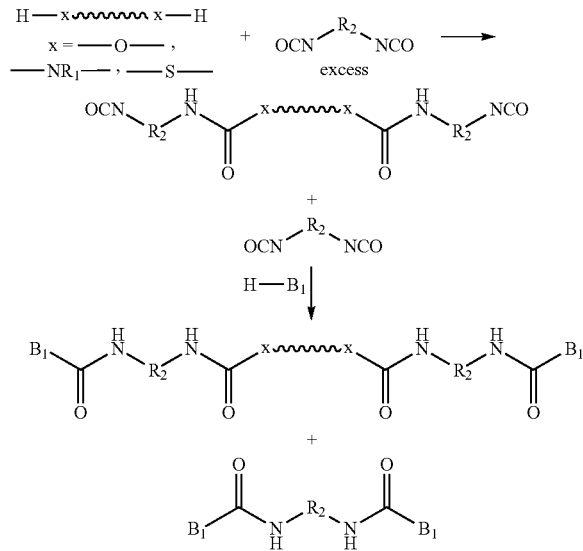

In Scheme 1 above, H-$B_1$ represents a UV-reactive blocking agent, $B_1$ represents a UV-reactive blocking group (such as an acrylate or methacrylate); $R_2$ represents an organic group, the wavy line represents a polymeric organic group (as found in a prepolymer); and x is as given therein. Polyols, polyamines, and polythiols useful as x∼∼∼ x in Scheme 1 are known. Examples include, but are not limited to, poly(ethylene glycol), poly(propylene glycol), poly(trimethylene glycol), poly(tetramethylene glycol) (PTMO), hydroxy-terminated poly(dimethylsiloxane), polyester diol especially polycaprolactone (PCL) diol, PTMO-PCL copolymer diol (Capa 7201A from Perstorp), hydroxy-terminated polybutadiene, and polyetheramines (for example JEFFAMINE® from Huntsman Corporation). A preferred polyol, polyamine, and polythiol is PTMO, with an average $M_n$ between 500 to 3000 Da.

"ABPU" as used herein refers to UV-curable, (meth)acrylate blocked, polyurethane/polyurea (i.e., reactive blocked polyurethane) such as described in U.S. Pat. Nos. 9,453,142 and 9,598,606 to Rolland et al. A particular example of a suitable reactive (or UV-curable) blocking group is a tertiary amine-containing (meth)acrylate (e.g., t-butylaminoethyl methacrylate, t-BAEMA).

Photoinitiators useful in the present invention include, but are not limited to, diphenyl(2,4,6-trimethylbenzoyl)phosphine oxide (TPO), Phenylbis(2,4,6-trimethylbenzoyl)phosphine oxide (PPO), 2-isopropylthioxanthone and/or 4-isopropylthioxanthone (ITX), etc.

"Diluents" as used herein includes both UV-curable (reactive) diluents (for example monoacrylates, mono-methacrylates, polyacrylates, polymethacrylates, acrylamides, methacrylamides, etc.), and non-UV-curable diluents (for example, plasticizers such as bis(2-ethylhexyl) phthalate, bis(2-propylheptyl) phthalate, diisononyl phthalate, tri-(2-ethylhexyl) trimellitate, bis(2-ethylhexyl) adipate, diisononyl adipate, dibutyl sebacate, diisobutyl maleate, etc.). Reactive diluents, being UV-curable, may also be considered as photopolymerizable monomers. In some embodiments, a vinyl caprolactam such as N-vinyl caprolactam may be used as a reactive diluent/photopolymerizable monomer.

Additional resin ingredients. Additional materials can be added to the resin mixture in order to enhance specific properties. These can be chosen such that they do not substantially interfere with the first or second stage polymerization processes and do not alter the viscosity such that the reactive mixture does not properly flow into the reaction zone during the first stage polymerization. These include short fibrous materials such as fiberglass and carbon fiber as well as other reinforcements such as graphene, carbon nanotubes and nanoclays. The concentration of these (and other) additives should be such that it does not render the first stage reaction mixture to be opaque to UV polymerization. Lubricants such as graphite, molybdenum disulfide and aliphatic and aromatic lubricating oils can be considered as additives for this invention. Flame retardant additives will be desired for specific applications of this invention and compounds such as aluminum diethyl phosphinate and brominated compounds can be considered as long as they do not interfere with the polymerization processes.

Accordingly, the liquid resin or polymerizable material can have solid particles suspended or dispersed therein. Any suitable solid particle can be used, depending upon the end product being fabricated. The particles can be metallic, organic/polymeric, inorganic, or composites or mixtures thereof. The particles can be nonconductive, semi-conductive, or conductive (including metallic and non-metallic or polymer conductors); and the particles can be magnetic, ferromagnetic, paramagnetic, or nonmagnetic. The particles can be of any suitable shape, including spherical, elliptical, cylindrical, etc. The particles can be of any suitable size (for example, ranging from 1 nm to 20 μm average diameter).

The particles can comprise an active agent or detectable compound as described below, though these may also be provided dissolved solubilized in the liquid resin as also discussed below. For example, magnetic or paramagnetic particles or nanoparticles can be employed.

The liquid resin can have additional ingredients solubilized therein, including pigments, dyes, active compounds or pharmaceutical compounds, detectable compounds (e.g., fluorescent, phosphorescent, radioactive), etc., again depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Non-reactive light absorbers. In some embodiments, polymerizable liquids for carrying out the present invention include a non-reactive pigment or dye that absorbs light, particularly UV light. Suitable examples of such light absorbers include, but are not limited to: (i) titanium dioxide (e.g., included in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a hydroxybenzophenone, hydroxyphenylbenzotriazole, oxanilide, benzophenone, thioxanthone, hydroxyphenyltriazine, and/or benzotriazole ultraviolet light absorber (e.g., Mayzo BLS1326) (e.g., included in an amount of 0.001 or 0.005 to 1, 2 or 4 percent by weight). Examples of suitable organic ultraviolet light absorbers include, but are not limited to, those described in U.S. Pat. Nos. 3,213,058; 6,916,867; 7,157,586; and 7,695,643, the disclosures of which are incorporated herein by reference.

Inhibitors of polymerization and release agents. Inhibitors or polymerization inhibitors for use in the present invention may be in the form of a liquid or a gas. In some embodiments, gas inhibitors are preferred. The specific inhibitor will depend upon the monomer being polymerized and the polymerization reaction. For free radical polymerization monomers, the inhibitor can conveniently be oxygen, which can be provided in the form of a gas such as air, a gas enriched in oxygen (optionally but in some embodiments preferably containing additional inert gases to reduce combustibility thereof), or in some embodiments pure oxygen gas. In some embodiments, oils or lubricants (e.g., fluorinated oils such as perfluoropolyethers) may be employed as release layers that maintain a liquid interface.

Fillers. Any suitable filler may be used in connection with the present invention, depending on the properties desired in the part or object to be made. Thus, fillers may be solid or liquid, organic or inorganic, and may include reactive and non-reactive rubbers: siloxanes, acrylonitrile-butadiene rubbers; reactive and non-reactive thermoplastics, including but not limited to: poly(ether imides), maleimide-styrene terpolymers, polyarylates, polysulfones and polyethersulfones, etc.) inorganic fillers such as silicates (such as talc, clays, silica, mica), glass, carbon nanotubes, graphene, cellulose nanocrystals, etc., including combinations of all of the foregoing. Suitable fillers include tougheners, such as core-shell rubbers, as discussed below.

Tougheners. One or more polymeric and/or inorganic tougheners can be used as a filler in the present invention. See generally U.S. Patent Application Publication No. 20150215430. The toughener may be uniformly distributed in the form of particles in the cured product. The particles could be less than 5 microns (μm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization. Examples of block copolymers include the copolymers whose composition is described in U.S. Pat. No. 6,894,113 (Court et al., Atofina, 2005) and include "NANOSTRENGTH®" SBM (polystyrene-polybutadiene-polymethacrylate), and AMA (polymethacrylate-polybutylacrylate-polymethacrylate), both produced by Arkema. Other suitable block copolymers include FORTEGRA™ and the amphiphilic block copolymers described in U.S. Pat. No. 7,820,760, assigned to Dow Chemical. Examples of known core-shell particles include the core-shell (dendrimer) particles whose compositions are described in U.S.20100280151 (Nguyen et al., Toray Industries, Inc., 2010) for an amine branched polymer as a shell grafted to a core polymer polymerized from polymerizable monomers containing unsaturated carbon-carbon bonds, core-shell rubber particles whose compositions are described in EP 1632533A1 and EP 2123711A1 by Kaneka Corporation, and the "KaneAce MX" product line of such particle/epoxy blends whose particles have a polymeric core polymerized from polymerizable monomers such as butadiene, styrene, other unsaturated carbon-carbon bond monomer, or their combinations, and a polymeric shell compatible with the epoxy, typically polymethylmethacrylate, polyglycidylmethacrylate, polyacrylonitrile or similar polymers, as discussed further below. Also suitable as block copolymers in the present invention are the "JSR SX" series of carboxylated polystyrene/polydivinylbenzenes produced by JSR Corporation; "Kureha Paraloid" EXL-2655 (produced by Kureha Chemical Industry Co., Ltd.), which is a butadiene alkyl methacrylate styrene copolymer; "Stafiloid" AC-3355 and TR-2122 (both produced by Takeda Chemical Industries, Ltd.), each of which are acrylate methacrylate copolymers; and "PARALOID" EXL-2611 and EXL-3387 (both produced by Rohm & Haas), each of which are butyl acrylate methyl methacrylate copolymers. Examples of suitable oxide particles include NANOPOX® produced by nanoresins AG. This is a master blend of functionalized nanosilica particles and an epoxy.

Core-shell rubbers. Core-shell rubbers are particulate materials (particles) having a rubbery core. Such materials are known and described in, for example, U.S. Patent Application Publication No. 20150184039, as well as U.S. Patent Application Publication No. 20150240113, and U.S. Pat. Nos. 6,861,475, 7,625,977, 7,642,316, 8,088,245, and elsewhere.

In some embodiments, the core-shell rubber particles are nanoparticles (i.e., having an average particle size of less than 1000 nanometers (nm)). Generally, the average particle size of the core-shell rubber nanoparticles is less than 500 nm, e.g., less than 300 nm, less than 200 nm, less than 100 nm, or even less than 50 nm. Typically, such particles are spherical, so the particle size is the diameter; however, if the particles are not spherical, the particle size is defined as the longest dimension of the particle.

In some embodiments, the rubbery core can have a glass transition temperature (Tg) of less than −25° C., more preferably less than −50° C., and even more preferably less than −70° C. The Tg of the rubbery core may be well below −100° C. The core-shell rubber also has at least one shell portion that preferably has a Tg of at least 50° C. By "core," it is meant an internal portion of the core-shell rubber. The core may form the center of the core-shell particle, or an internal shell or domain of the core-shell rubber. A shell is a portion of the core-shell rubber that is exterior to the rubbery core. The shell portion (or portions) typically forms the outermost portion of the core-shell rubber particle. The shell material can be grafted onto the core or is cross-linked. The rubbery core may constitute from 50 to 95%, or from 60 to 90%, of the weight of the core-shell rubber particle.

The core of the core-shell rubber may be a polymer or copolymer of a conjugated diene such as butadiene, or a lower alkyl acrylate such as n-butyl-, ethyl-, isobutyl- or 2-ethylhexylacrylate. The core polymer may in addition contain up to 20% by weight of other copolymerized mono-unsaturated monomers such as styrene, vinyl acetate, vinyl chloride, methyl methacrylate, and the like. The core polymer is optionally cross-linked. The core polymer optionally contains up to 5% of a copolymerized graft-linking monomer having two or more sites of unsaturation of unequal reactivity, such as diallyl maleate, monoallyl fumarate, allyl methacrylate, and the like, at least one of the reactive sites being non-conjugated.

The core polymer may also be a silicone rubber. These materials often have glass transition temperatures below −100° C. Core-shell rubbers having a silicone rubber core include those commercially available from Wacker Chemie, Munich, Germany, under the trade name Genioperl®.

The shell polymer, which is optionally chemically grafted or cross-linked to the rubber core, can be polymerized from at least one lower alkyl methacrylate such as methyl methacrylate, ethyl methacrylate or t-butyl methacrylate. Homopolymers of such methacrylate monomers can be used. Further, up to 40% by weight of the shell polymer can be formed from other monovinylidene monomers such as styrene, vinyl acetate, vinyl chloride, methyl acrylate, ethyl acrylate, butyl acrylate, and the like. The molecular weight of the grafted shell polymer can be between 20,000 and 500,000.

One suitable type of core-shell rubber has reactive groups in the shell polymer which can react with an epoxy resin or an epoxy resin hardener. Glycidyl groups are suitable. These can be provided by monomers such as glycidyl methacrylate.

One example of a suitable core-shell rubber is of the type described in U.S. Patent Application Publication No. 2007/0027233 (EP 1632533 A1). Core-shell rubber particles as described therein include a cross-linked rubber core, in most cases being a cross-linked copolymer of butadiene, and a shell which is preferably a copolymer of styrene, methyl methacrylate, glycidyl methacrylate and optionally acrylonitrile. The core-shell rubber is preferably dispersed in a polymer or an epoxy resin, also as described in the document.

Suitable core-shell rubbers include, but are not limited to, those sold by Kaneka Corporation under the designation Kaneka Kane Ace, including the Kaneka Kane Ace 15 and 120 series of products, including Kaneka Kane Ace MX 120, Kaneka Kane Ace MX 153, Kaneka Kane Ace MX 154, Kaneka Kane Ace MX 156, Kaneka Kane Ace MX170, Kaneka Kane Ace MX 257 and Kaneka Kane Ace MX 120 core-shell rubber dispersions, and mixtures thereof.

II. Methods of Making Intermediates

The three-dimensional intermediate is preferably formed from resins as described above by additive manufacturing, typically bottom-up or top-down additive manufacturing, generally known as stereolithography. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication Nos. 2013/0292862 to Joyce, and U.S. Patent Application Publication No. 2013/0295212 to Chen et al. The disclosures of these patents and applications are incorporated by reference herein in their entirety.

In general, top-down three-dimensional fabrication is carried out by:

(a) providing a polymerizable liquid reservoir having a polymerizable liquid fill level and a carrier positioned in the reservoir, the carrier and the fill level defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light to form a solid polymer scaffold from the first component and also advancing (typically lowering) the carrier away from the build surface to form a three-dimensional intermediate having the same shape as, or a shape to be imparted to, the three-dimensional object and containing said second solidifiable component carried in the scaffold in unsolidified and/or uncured form.

"Shape to be imparted to" refers to the case where the shape of the intermediate object slightly changes between formation thereof and forming the subsequent three-dimensional product, typically by shrinkage (e.g., up to 1, 2 or 4 percent by volume), expansion (e.g., up to 1, 2 or 4 percent by volume), removal of support structures, or by intervening forming steps (e.g., intentional bending, stretching, drilling, grinding, cutting, polishing, or other intentional forming after formation of the intermediate product, but before formation of the subsequent three-dimensional product).

A wiper blade, doctor blade, or optically transparent (rigid or flexible) window, may optionally be provided at the fill level to facilitate leveling of the polymerizable liquid, in accordance with known techniques. In the case of an optically transparent window, the window provides a build surface against which the three-dimensional intermediate is formed, analogous to the build surface in bottom-up three-dimensional fabrication as discussed below.

In general, bottom-up three-dimensional fabrication is carried out by:

(a) providing a carrier and an optically transparent member having a build surface, the carrier and the build surface defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light through said optically transparent member to form a solid polymer scaffold from the first component and also advancing (typically raising) the carrier away from the build surface to form a three-dimensional intermediate having the same shape as, or a shape to be imparted to, the three-dimensional object and containing said second solidifiable component carried in the scaffold in unsolidified and/or uncured form.

In some embodiments of bottom-up or top-down three-dimensional fabrication as implemented in the context of the present invention, the build surface is stationary during the formation of the three-dimensional intermediate; in other embodiments of bottom-up three-dimensional fabrication as implemented in the context of the present invention, the build surface is tilted, slid, flexed and/or peeled, and/or otherwise translocated or released from the growing three-dimensional intermediate, usually repeatedly, during formation of the three-dimensional intermediate.

In some embodiments of bottom-up or top-down three-dimensional fabrication as carried out in the context of the present invention, the polymerizable liquid (or resin) is maintained in liquid contact with both the growing three-dimensional intermediate and the build surface during both the filling and irradiating steps, during fabrication of some of, a major portion of, or all of the three-dimensional intermediate.

In some embodiments of bottom-up or top-down three-dimensional fabrication as carried out in the context of the present invention, the growing three-dimensional intermediate is fabricated in a layerless manner (e.g., through multiple exposures or "slices" of patterned actinic radiation or light) during at least a portion of the formation of the three-dimensional intermediate.

In some embodiments of bottom-up or top-down three-dimensional fabrication as carried out in the context of the present invention, the growing three-dimensional intermediate is fabricated in a layer-by-layer manner (e.g., through multiple exposures or "slices" of patterned actinic radiation or light), during at least a portion of the formation of the three-dimensional intermediate.

In some embodiments of bottom-up or top-down three-dimensional fabrication employing a rigid or flexible optically transparent window, a lubricant or immiscible liquid may be provided between the window and the polymerizable liquid (e.g., a fluorinated fluid or oil such as a perfluoropolyether oil).

From the foregoing it will be appreciated that, in some embodiments of bottom-up or top-down three-dimensional fabrication as carried out in the context of the present invention, the growing three-dimensional intermediate is fabricated in a layerless manner during the formation of at least one portion thereof, and that same growing three-dimensional intermediate is fabricated in a layer-by-layer manner during the formation of at least one other portion thereof. Thus, operating mode may be changed once, or on multiple occasions, between layerless fabrication and layer-by-layer fabrication, as desired by operating conditions such as part geometry.

In preferred embodiments, the intermediate is formed by continuous liquid interface production (CLIP). CLIP is known and described in, for example, PCT Application Nos. PCT/US2014/015486 (published as U.S. Pat. No. 9,211,678); PCT/US2014/015506 (also published as U.S. Pat. No. 9,205,601), PCT/US2014/015497 (also published as U.S. Pat. No. 9,216,546), and in J. Tumbleston, D. Shirvanyants, N. Ermoshkin et al., Continuous liquid interface production of 3D Objects, *Science* 347, 1349-1352 (2015). In some embodiments, CLIP employs features of a bottom-up three-dimensional fabrication as described above, but the irradiating and/or said advancing steps are carried out while also concurrently maintaining a stable or persistent liquid interface between the growing object and the build surface or window, such as by: (i) continuously maintaining a dead zone of polymerizable liquid in contact with said build surface, and (ii) continuously maintaining a gradient of polymerization zone (such as an active surface) between the dead zone and the solid polymer and in contact with each thereof, the gradient of polymerization zone comprising the first component in partially cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone.

In some embodiments, the stable liquid interface may be achieved by other techniques, such as by providing an immiscible liquid as the build surface between the polymerizable liquid and the optically transparent member, by feeding a lubricant to the build surface (e.g., through an optically transparent member which is semipermeable thereto, and/or serves as a reservoir thereof), etc.

While the dead zone and the gradient of polymerization zone do not have a strict boundary therebetween (in those locations where the two meet), the thickness of the gradient of polymerization zone is in some embodiments at least as great as the thickness of the dead zone. Thus, in some embodiments, the dead zone has a thickness of from 0.01, 0.1, 1, 2, or 10 microns up to 100, 200 or 400 microns, or more, and/or the gradient of polymerization zone and the dead zone together have a thickness of from 1 or 2 microns up to 400, 600, or 1000 microns, or more. Thus the gradient of polymerization zone may be thick or thin depending on the particular process conditions at that time. Where the gradient of polymerization zone is thin, it may also be described as an active surface on the bottom of the growing three-dimensional object, with which monomers can react and continue to form growing polymer chains therewith. In some embodiments, the gradient of polymerization zone, or active surface, is maintained (while polymerizing steps continue) for a time of at least 5, 10, 15, 20 or 30 seconds, up to 5, 10, 15 or 20 minutes or more, or until completion of the three-dimensional product.

The method may further comprise the step of disrupting the gradient of polymerization zone for a time sufficient to form a cleavage line in the three-dimensional object (e.g., at a predetermined desired location for intentional cleavage, or at a location in the object where prevention of cleavage or reduction of cleavage is non-critical), and then reinstating the gradient of polymerization zone (e.g. by pausing, and resuming, the advancing step, increasing, then decreasing, the intensity of irradiation, and combinations thereof).

CLIP may be carried out in different operating modes (that is, different manners of advancing the carrier and build surface away from one another), including continuous, intermittent, reciprocal, and combinations thereof.

Thus in some embodiments, the advancing step is carried out continuously, at a uniform or variable rate, with either constant or intermittent illumination or exposure of the build area to the light source.

In other embodiments, the advancing step is carried out sequentially in uniform increments (e.g., of from 0.1 or 1 microns, up to 10 or 100 microns, or more) for each step or increment. In some embodiments, the advancing step is carried out sequentially in variable increments (e.g., each increment ranging from 0.1 or 1 microns, up to 10 or 100 microns, or more) for each step or increment. The size of the increment, along with the rate of advancing, will depend in part upon factors such as temperature, pressure, structure of the article being produced (e.g., size, density, complexity, configuration, etc.).

In some embodiments, the rate of advance (whether carried out sequentially or continuously) is from about 0.1 1, or 10 microns per second, up to about to 100, 1,000, or 10,000 microns per second, again depending again depending on factors such as temperature, pressure, structure of the article being produced, intensity of radiation, etc.

In still other embodiments, the carrier is vertically reciprocated with respect to the build surface to enhance or speed the refilling of the build region with the polymerizable liquid. In some embodiments, the vertically reciprocating step, which comprises an upstroke and a downstroke, is carried out with the distance of travel of the upstroke being greater than the distance of travel of the downstroke, to thereby concurrently carry out the advancing step (that is, driving the carrier away from the build plate in the Z dimension) in part or in whole.

In some embodiments, the solidifiable or polymerizable liquid is changed at least once during the method with a subsequent solidifiable or polymerizable liquid (e.g., by switching a "window" or "build surface" and associated reservoir of polymerizable liquid in the apparatus); optionally where the subsequent solidifiable or polymerizable liquid is cross-reactive with each previous solidifiable or polymerizable liquid during the subsequent curing, to form an object having a plurality of structural segments covalently coupled to one another, each structural segment having different structural (e.g., tensile) properties (e.g., a rigid funnel or liquid connector segment, covalently coupled to a flexible pipe or tube segment).

Other approaches for carrying out CLIP that can be used in the present invention and potentially obviate the need for a semipermeable "window" or window structure include utilizing a liquid interface comprising an immiscible liquid (see L. Robeson et al., WO 2015/164234), generating oxygen as an inhibitor by electrolysis (see I Craven et al., WO 2016/133759), and incorporating magnetically positionable particles to which the photoactivator is coupled into the polymerizable liquid (see J. Rolland, WO 2016/145182), particularly if employed under anhydrous conditions (e.g., the immiscible liquid is not water-based).

Once the three-dimensional intermediate is formed, it may be removed from the carrier and washed as discussed below. Preferably, the optional washing step is performed under conditions appropriate to remove unreacted resin from the surface of the polymerized three-dimensional intermediate, but not appreciably extract unreacted Part B constituents (e.g., caprolactam). Before or after washing, or after the further curing (such as by heating and/or microwave irradiating), any supports can be removed, and any other modifications optionally made (cutting, welding, adhesively bonding, joining, grinding, drilling, etc.).

III. Part B—Component for Caprolactam Polymerization

As noted above, in some embodiments of the invention, the polymerizable liquid comprises a first light polymerizable component (sometimes referred to as "Part A" herein). The polymerizable liquid may optionally but preferably also contain a member of a reactive pair, which reactive pair solidifies by another mechanism, or in a different manner from, the first component (these components together sometimes referred to as "Part B" herein), typically by further reacting, polymerizing, or chain extending. In the present application, Part B comprises mixtures for anionic caprolactam polymerization to nylon 6. That is, Part B comprises caprolactam, an initiator and a catalyst for caprolactam polymerization.

Part A chemistry. As noted above, Part A of the resin composition comprises or consists of a mix of monomers and/or prepolymers that can be polymerized by exposure to actinic radiation or light. In some embodiments, Part A can react to form a cross-linked polymer network or a solid homopolymer. In some embodiments, the resin is preferably capable of crosslinking with polymerization. Thus, divinyl, trivinyl and/or polyvinyl functional monomers are preferred to be included with the vinyl monomers of Part A.

A purpose of Part A is to "lock" the shape of the object being formed or create a scaffold for the one or more additional components (e.g., Part B). Importantly, Part A is present at or above the minimum quantity needed to maintain the shape of the object being formed after the initial solidification. In some embodiments, this amount corresponds to less than ten, twenty, or thirty percent by weight of the total resin (polymerizable liquid) composition.

Examples of suitable reactive end groups suitable for Part A constituents, monomers, or prepolymers include, but are not limited to: acrylates, methacrylates, α-olefins, N-vinyls, acrylamides, methacrylamides, styrenics, epoxides, thiols, 1,3-dienes, vinyl halides, acrylonitriles, vinyl esters, maleimides, and vinyl ethers.

An aspect of the solidification of Part A is that it provides a scaffold in which the second reactive resin component, termed "Part B," can solidify during a second step (which may occur concurrently with or following the solidification of Part A). This secondary reaction preferably occurs without significantly distorting the original shape defined during the solidification of Part A. Alternative approaches would lead to a distortion in the original shape in a desired manner.

In particular embodiments, when used in the methods and apparatus described herein, the solidification of Part A is continuously inhibited during printing within a certain region, by oxygen or other reactive species, to form a liquid interface between the solidified part and an inhibitor-permeable film or window (e.g., is carried out by continuous liquid interface printing).

Part B chemistry. Part B herein comprises monomers of caprolactam that participate in a second solidification reaction after the Part A solidification reaction. Examples of methods used to solidify Part B include, but are not limited to, contacting the object or scaffold to heat, microwave irradiation, etc., including combinations thereof.

Captrolactam, also known as ε-caprolactam or 2-oxohexamethylenimine, is a lactam (cyclic amide) or caproic acid. The polymerization of caprolactam to form nylon 6 is known to be possible via three different processes: hydrolytic, cationic and anionic polymerization. Hydrolytic polymerization involves water (5-10%) and temperatures in range of 250 to 270° C. for over 12 hours. Cationic polymerization involve protonic and Lewis acids to initiate the polymerization. Anionic polymerization employs a catalyst and an initiator to produce nylon 6. These processes are detailed in: Principles of Polymerization, George Odian, 2nd edition, John Wiley & Sons, New York, 1981. Anionic polymerization is the preferred process to prepare 3D articles of this invention.

Initiators for anionic polymerization of caprolactam. For the anionic polymerization of caprolactam, Part B comprises an initiator for caprolactam polymerization to nylon 6. Initiators for anionic polymerization of caprolactam include, but are not limited to, N-acetyl caprolactam, bislactams such as N,N'-adipoyl-bis-caprolactam, bischloroformates such as the bischloroformate of dihydroxy poly(tetramethylene glycol), 4,4'- dichlorodiphenylsulfone, 4,4'-difluorodiphenylsulfone, acetic anhydride, and the like. See also U.S. Pat. No. 3,366,608 to Lincoln et al. Initiators for anionic polymerization of caprolactam also include isocyanates. The isocyanates are preferably diisocyanates such as MDI, HMDI, TDI and the like.

Isocyanates (including diisocyanates) useful in carrying out the present invention include, but are not limited to, 1,1'-methylenebis(4-isocyanatobenzene) (MDI), 2,4-diisocyanato-1-methylbenzene (TDI), methylene-bis(4-cyclohexylisocyanate) ($H_{12}$MDI), hexamethylene diisocyanate (HDI), isophorone diisocyanate (IPDI), polymeric MDI, 1,4-phenylene diisocyanate (PPDI), and o-tolidine diisocyanate (TODI). A preferred diisocyanate is $H_{12}$MDI, such as Desmodur® W, supplied by Covestro AG (Germany). Additional examples include but are not limited to those given in U.S. Pat. No. 3,694,389 to Levy.

Many isocyanates are very efficient initiators, allowing caprolactam to polymerize at temperatures just above the melting point of caprolactam (69° C.). The rapid reaction rate, while desired for Part B polymerization, may not allow for sufficient viscosity stability during the Part A polymerization process. Therefore, it is preferred that isocyanates used as initiators for the Part B chemistry be provided as blocked isocyantes for Part A.

Thus, in some embodiments, the initiators may be provided in the polymerizable liquid as a reactive blocked isocyanate such as described above for Part A (capable of polymerization with the vinylic network) and/or a blocked isocyanate comprising a non-polymerizable blocking group (preferably volatile), which blocking group may be removed to participate in the Part B chemistry. In some embodiments, the blocking group may be chosen such that deblocking occurs in a range of from 50, 70 or 80° C. to 100, 150, 175, or 200° C.

"VBPU" as used herein refers to a volatile blocking group blocked, polyurethane/polyurea. VBPUs can be prepared in accordance with known procedures (see, e.g., U.S. Pat. No. 3,694,389 to Levy) or variations thereof that will be apparent to those skilled in the art. "Volatile blocking group" as used herein refers to a substituent produced by the covalent coupling of a volatile blocking agent to the reactive group (particularly an isocyanate group) of a reactive compound (such as a diisocyanate monomer or prepolymer).

Volatile blocking agents that may be used to carry out the present invention include, for example, ketoximes, amides, imides, imidazoles, pyrazoles, alcohols, and sterically-hindered amines, such as 2-butanone oxime (also called methyl ethyl ketoxime or "MEKO"), acetone oxime, cyclopentanone oxime, cyclohexanone oxime, ε-caprolactam, N-methylacetamide, imidazole, succinimide, benzotriazole, N-hydroxyphthalimide, 1,2,4-triazole, 2-ethyl-1-hexanol, phenol, 3,5-dimethylpyrazole, 2,2,6,6-tetramethylpiperidine, and diisopropylamine (see, e.g., Scheme 2). In some embodiments, the volatile blocking group may be chosen such that deblocking occurs in a range of from 50, 70 or 80° C. to 100, 150, 175, or 200° C.

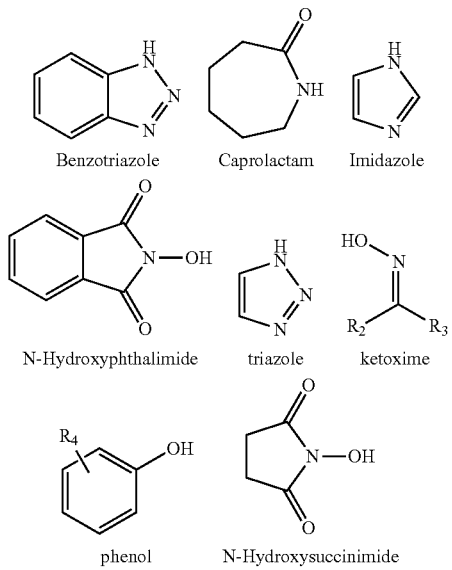

Scheme 2. Examples of volatile blocking agents.

Catalysts useful to prepare VBPUs from prepolymers and volatile blocking groups include, but are not limited to, dibutyltin dilaurate, stannous octoate, and bismuth octoate. A preferred catalyst is the bismuth catalyst K-KAT 348, supplied by King Industries, Inc. (Norwalk, Conn.).

In some embodiments, the volatile blocking agent is caprolactam, which caprolactam upon deblocking may participate in the nylon 6 polymerization.

In addition, and as noted above, in some embodiments, a vinyl caprolactam such as N-vinyl caprolactam may be provided as a reactive diluent/photopolymerizable monomer in the methods taught herein, which may act to couple at least some of the nylon 6 to the Part A polymerized network.

Catalyst for anionic polymerization of caprolactam. For the anionic polymerization of caprolactam, Part B also comprises a catalyst for anionic polymerization of caprolactam. In some embodiments, the catalyst for anionic polymerization of caprolactam is the product of a strong base reacting with caprolactam to yield an alkali metal or alkaline earth metal complexed caprolactam (e.g., sodium caprolactam). Other bases can be considered for the catalyst of this polymerization such as alkali metals, metal hydrides, metal amides and organometallic materials such as sodium naphthalene. See also U.S. Pat. No. 3,366,608 to Lincoln et al.

In some embodiments, the catalyst for anionic polymerization of caprolactam is sodium caprolactam. A preferred route for preparation of this catalyst is to add (slowly) sodium hydride to molten caprolactam with stirring applied under an inert atmosphere of dry nitrogen or argon sweeping the reaction container so the liberated hydrogen is removed.

Preferably, the caprolactam monomers and other components of the resins used in accordance with the present invention are anhydrous, and the process is conducted under anhydrous conditions, as water will interfere with the polymerization reaction. The water content of the reactive mixture is preferably below 1000 ppm (parts per million by weight) of water, more preferably less than 100 ppm, and most preferably below 30 ppm of water.

In one example embodiment, anhydrous caprolactam (2-oxohexamethylenimine) is mixed with sodium hydride and heated to a temperature just above the melting point of caprolactam (69° C.) to produce a mixture of approximately 99 percent by weight caprolactam and 1 percent by weight sodium caprolactam (the sodium caprolactam serving as an anionic polymerization catalyst for the subsequent polymerization of caprolactam into polycaprolactam, discussed below). Sodium hydride addition should be slow with stirring applied to the liquid caprolactam and under a dry inert atmosphere (e.g., argon or nitrogen).

A dual cure resin is then prepared by mixing together, under anhydrous conditions:
- 50% by weight of the caprolactam-sodium caprolactam mixture described above (while still in liquid form);
- 29.5% by weight reactive diluent (e.g., isobornyl acrylate);
- 20% by weight blocked polyisocyanate (e.g., ABPU, VBPU, or a mixture thereof); and
- 0.5% photoinitiator (e.g., Diphenyl(2,4,6-trimethylbenzoyl)phosphine oxide (TPO)).

In some embodiments, the Part A component may range from 20 wt % to 80 wt % (vinylic monomers and/or prepolymers, photoinitiator and reactive diluents). The Part B component (caprolactam, catalyst, initiator) may comprise from 20 wt % to 80 wt %. The catalyst concentration may be from 0.5 and 5 mole percent sodium (or other alkali metal) caprolactam based on caprolactam molar content. The initiator may comprise between 0.5 and 5 mole percent also based on the caprolactam molar concentration. Additives such as plasticizers, fillers, lubricating oils, flame retardants, etc. may also be included, as noted above. Other lactam (cyclic amide) monomers such as lauryl lactam may also be included as optional reactive additives, e.g., added or substituted for caprolactam in this invention to provide specific property variants such as toughness.

The melting point of caprolactam (69° C.) will typically be lowered when combined with Part A in the UV-polymerizable liquid. Depending on the composition and the components, the melting point may be depressed to below room temperature or slightly above. In some embodiments, the Part A (first stage) polymerization is carried out above (but in some embodiments close to) the reactive mixture melting point.

After the intermediate three-dimensional object is formed, it is optionally washed, optionally dried (e.g., air dried) and/or rinsed (in any sequence). It is then further cured, preferably by heating (although further curing may in some embodiments be concurrent with the first cure, or may be by different mechanisms, as described in U.S. Pat. No. 9,453,142 to Rolland et al.).

The dual cure resin prepared as described above is heated to, preferably, above the melting point of the reactive mixture (which could be done by placing onto a heated build plate of a Carbon, Inc. M1 additive manufacturing apparatus under a blanket of nitrogen (the apparatus modified to incorporate heating of the cassette and a dehumidified atmosphere, such as a nitrogen atmosphere, in the build chamber)), and a three-dimensional intermediate object prepared thereon.

The intermediate object is then optionally washed with an organic solvent (for example, diethyl ether, tetrahydrofuran, ethyl acetate, benzene, toluene, N,N-dimethylformamide, propylene carbonate, dimethyl carbonate, etc.), and then further heated to a temperature of at least 80° C., to 100, 120 or 140° C., at which point the initiator (e.g., an isocyanate that is now deblocked) serves to initiate the exothermic anionic polymerization of caprolactam (catalyzed by the catalyst as noted above) to produce polycaprolactam (poly (hexano-6-lactam), nylon-6), the polycaprolactam formed as a sequential interpenetrating polymer network with the remainder of the light-polymerized polymer network.

Note the anionic polymerization of nylon 6 is a solid state polymerization occurring below the nylon 6 melting point. As such, it has a higher melting point (220° C.), higher level of crystallization, higher modulus, and higher strength than conventional nylon 6. If it is melted, then the properties revert to conventional nylon 6. When processes described herein are performed below the melting point, the properties should be somewhat better than expected for nylon 6, as noted above.

In some embodiments, it is desired that the formed article not be subjected to temperatures exceeding the melting point, as the higher level of crystallinity will not be maintained, and the strength and modulus of the part will decrease. The advantages of conducting the polymerization below the melting point (in essence as a solid state polymerization) allows for properties superior to conventional thermoplastic nylon 6.

As noted above, heat treatment steps may be conducted below the melting point of nylon 6 (approximately 220° C.). Heating may be performed, e.g., in an oven, such as an electric, gas, solar oven or microwave oven, or combination thereof. In some embodiments, the heating step is carried out with at least a first (oven) temperature and a second (oven) temperature, with the first temperature greater than room temperature, the second temperature greater than the first temperature, and the second temperature less than 210 or 200° C. (e.g., with ramped or step-wise increases between room temperature and the first temperature, and/or between the first temperature and the second temperature. See, e.g., U.S. Pat. No. 4,785,075).

For example, the intermediate may be heated in a stepwise manner at a first temperature of about 50° C. to about 60° C., and then at a second temperature of about 80° C. to about 150° C., with the duration of each heating depending on the size, shape, and/or thickness of the intermediate. The second temperature may be held for an extended length of time ("annealing"), for example, 10, 20 or 30 minutes, to 1, 2, 3, 4 or 5 or more hours.

IV. Articles of 3D Manufacture

Articles that may be produced by the methods taught herein include, but are not limited to, gears, bushings, sprockets, valves, seals, tool housings, chain guides, slides, glides, complex electronic parts and the like.

Articles produced by the methods of this invention may be provided having shapes that cannot be produced other than by 3D processes and/or are useful where the parts desired may be limited in number where other processes such as injection molding would be too expensive due to mold costs.

In some embodiments, the resultant polymerized article can comprise a significant amount of nylon 6 (e.g., about 30, 40, 50, 60, 75 or 80 wt %).

In some embodiments, the UV curable matrix is chosen to provide desired properties to the included nylon 6 (such as stiffness, toughness).

In some embodiments, the article comprising nylon 6 has improved properties as compared to conventional nylon 6, for example, has a higher melting point (220° C.), higher level of crystallization, higher modulus, and/or higher strength than conventional nylon 6, as also noted above.

The present invention is explained in greater detail in the following examples. Abbreviations used below are given in the detailed description above.

EXAMPLE 1

General Method of Making Nylon 6 by Additive Manufacturing

Caprolactam (anhydrous) is melted in an appropriate container and sodium hydride is slowly added with stirring applied, and an inert gas is introduced in the void space above the liquid caprolactam to remove the generated hydrogen. The caprolactam is cooled to just above the melting point (69° C.) and the reactants of the first stage (vinylic monomers, photoinitiator and caprolactam polymerization initiator) and other substances as desired are added. The resultant mixture will have a lower melting point due to melting point depression of caprolactam. The mixture is transferred to the 3D polymerization apparatus and the article to be fabricated is polymerized during the first stage via UV polymerization. After the first stage polymerization, the part is heated to an appropriate temperature to commence the second stage polymerization (anionic polymerization of caprolactam). After the second stage polymerization, the part can be further annealed (heated at an elevated temperature, such as 150° C., for an extended length of time) and then cooled and immersed in an appropriate non-solvent to remove unreacted substances. Such non-solvents may be, for example, methanol or isopropanol.

EXAMPLE 2

Specific Illustrative Example A

A 500 ml 3 necked glass container is used, with one neck comprising a stirring rod, one neck utilized for reactant addition and the third neck utilized for dry nitrogen or argon blanketing. A heating mantel is employed to control the temperature. 200 grams of ε-caprolactam is added to the heated container (heated to 80° C. to melt the caprolactam). The caprolactam is dried by bubbling dry nitrogen or argon with stirring applied. Na hydride (powder form) is slowly added to the stirring caprolactam to yield a concentration of 1.5 wt % Na caprolactam in the caprolactam solution. A slow stream of dry nitrogen or argon is supplied to the container to remove hydrogen resulting from the reaction of Na hydride with caprolactam. 100 grams of isobornylmethacrylate (IBMA) and 20 grams of trimethylolpropane triacrylate are added to the stirring caprolactam. The temperature is lowered to just above the melting point of the mixture and 80 grams of acrylate blocked polyurethane (ABPU) comprised of 1K PTMO center block is added. 2 grams of the UV initiator PPO is added and cooled again to just above the mixture melting point. The resultant mixture is transferred to the 3D printing apparatus chamber heated to just above the mixture melting point and blanketed with dry nitrogen. The 3D polymerization is conducted to produce a UV polymerized part. Upon completion of the part polymerization, the part is transferred (under anhydrous conditions) to a heating chamber where the part is heated slowly up to 150° over a time period of 30 minutes. The temperature during this step deblocks the isocyanate and initiates the polymerization of nylon 6. The part is then post-cured at 160° C. for one hour. The part is removed and soaked in hot or boiling methanol to remove unreacted monomers.

EXAMPLE 3

Specific Illustrative Example B

A 500 ml 3 necked glass container is used, with one neck comprising a stirring rod, one neck utilized for reactant addition and the third neck utilized for dry nitrogen or argon blanketing. A heating mantel is employed to control the temperature. 200 grams of ε-caprolactam is added to the heated container (heated to 80° C. to melt the caprolactam). The caprolactam is dried by bubbling dry nitrogen or argon with stirring applied. Na hydride (powder form) is slowly added to the stirring caprolactam to yield a concentration of 2.0 wt % Na caprolactam in the caprolactam solution. A slow stream of dry nitrogen or argon is supplied to the container to remove hydrogen resulting from the reaction of Na hydride with caprolactam. 8 grams of 4,4' dichlorodiphenylsulfone or optionally 8 grams of 4,4' difluorodiphenylsulfone are added and dissolved in the liquid caprolactam. 160 grams of ethyl methacrylate and 40 grams of trimethylolpropane triacrylate are added to the stirring caprolactam. 2 grams of the UV initiator PPO is added and cooled again to just above the mixture melting point. The resultant mixture is transferred to the 3D printing apparatus chamber heated to just above the mixture melting point and blanketed with dry nitrogen. The 3D polymerization is conducted to produce a UV polymerized part. Upon completion of the part polymerization, the part is transferred (under anhydrous conditions) to a heating chamber where the part is heated slowly up to 160° over a time period of 20 minutes. The part is then post-cured at 160° C. for two hours. The part is removed and soaked in hot or boiling methanol to remove unreacted monomers.

The foregoing is illustrative of the present invention, and is not to be construed as limiting thereof. The invention is defined by the following claims, with equivalents of the claims to be included therein.

We claim:

1. A method of forming a three-dimensional object comprising nylon 6, comprising:
    (a) providing a carrier and an optically transparent member having a build surface, said carrier and said build surface defining a build region therebetween;
    (b) filling said build region with a polymerizable liquid, said polymerizable liquid comprising a mixture of: (i) a light polymerizable first component, and (ii) a heat polymerizable second component;
    said heat polymerizable second component comprising (i) caprolactam monomers, (ii) a catalyst for anionic polymerization of caprolactam, and (iii) an initiator for anionic polymerization of caprolactam;
    (c) irradiating said build region with light through said optically transparent member to form a solid polymer scaffold from said first component and also advancing said carrier and said build surface away from one another to form a three-dimensional intermediate having the same shape as, or a shape to be imparted to, said three-dimensional object, with said three-dimensional intermediate containing said heat polymerizable second component in unpolymerized form; and then
    (d) heating said three-dimensional intermediate and polymerizing said caprolactam to form said three-dimensional object comprising nylon 6.

2. The method of claim 1, wherein said catalyst for anionic polymerization of caprolactam comprises an alkali metal or alkaline earth metal complexed caprolactam, an alkali metal, a metal hydride, a metal amide or an organometallic material.

3. The method of claim 1, wherein said catalyst for anionic polymerization of caprolactam comprises sodium caprolactam.

4. The method of claim 1, wherein said catalyst for anionic polymerization of caprolactam is provided at a concentration of from 0.5 to 5 mole percent of the caprolactam monomer molar content.

5. The method of claim 1, wherein said initiator for anionic polymerization of caprolactam comprises N-acetyl caprolactam, a bislactam, a bischloroformate, 4, 4'- dichlorodiphenylsulfone, 4,4'-difluorodiphenylsulfone, acetic anhydride, or an isocyanate.

6. The method of claim 1, wherein said initiator for anionic polymerization of caprolactam comprises an isocyanate, said isocyanate is provided as a blocked isocyanate, and said heating of step (d) is sufficient to deblock said blocked isocyanate, thus forming said initiator for anionic polymerization of caprolactam.

7. The method of claim 6, wherein the isocyanate comprises a reactive blocked isocyanate.

8. The method of claim 6, wherein the isocyanate comprises a volatile blocked isocyanate.

9. The method of claim 6, wherein the isocyanate comprises a reactive blocked isocyanate and a volatile blocked isocyanate.

10. The method of claim 1, wherein said initiator for anionic polymerization of caprolactam is provided at a concentration of from 0.5 to 5 mole percent of the caprolactam monomer molar content.

11. The method of claim 1, wherein the polymerizable liquid is anhydrous.

12. The method of claim 1, wherein said irradiating/advancing and/or heating steps are carried out under anhydrous conditions.

13. The method of claim 1, wherein said light polymerizable first component comprises a reactive blocked isocyanate.

14. The method of claim 13, wherein said reactive blocked isocyanate is included in said polymerizable liquid in an amount of from 1 percent by weight, to 50 percent by weight, or more.

15. The method of claim 1, said polymerizable liquid further comprising at least one photoinitiator, optionally at least one dye, and optionally at least one filler.

16. The method of claim 1, wherein said three-dimensional object comprises a polymer blend, interpenetrating polymer network, semi-interpenetrating polymer network, or sequential interpenetrating polymer network formed from said first component and said second component.

17. The method of claim 1, wherein said heating is carried out to a temperature that is below the melting point of nylon 6.

18. The method of claim 1, wherein:
said light polymerizable first component comprises a blocked isocyanate that is blocked with a light reactive blocking group; and
said heating step (d) is carried out under conditions in which at least a portion of said solid polymer scaffold produced by light polymerization of said first component degrades and forms an isocyanate initiator that participates in heat polymerizing of caprolactam to form said three-dimensional object comprising nylon 6.

19. The method of claim 18, wherein said light reactive blocking group comprises two or more ethylenically unsaturated end groups.

20. The method of claim 1, wherein said irradiating and/or said advancing steps are carried out while also concurrently: (i) continuously maintaining a dead zone of polymerizable liquid in contact with said build surface, and (ii) continuously maintaining a gradient of polymerization zone between said dead zone and said solid polymer scaffold and in contact with each thereof, said gradient of polymerization zone comprising said first component in partially cured form,
optionally wherein said optically transparent member comprises a semipermeable member, and said continuously maintaining a dead zone is carried out by feeding an inhibitor of polymerization through said optically transparent member, thereby creating a gradient of inhibitor in said dead zone and optionally in at least a portion of said gradient of polymerization zone,
optionally wherein said optically transparent member comprises a fluoropolymer,
and optionally wherein said first component comprises a free radical polymerizable liquid and said inhibitor comprises oxygen.

21. A three-dimensional object comprising nylon 6 produced by the method of claim 1, optionally wherein said object is selected from the group consisting of: gears, bushings, sprockets, valves, seals, tool housings, chain guides, slides, glides, and complex electronic parts.

22. The method of claim 1, wherein the polymerizable liquid comprises less than 1000 parts per million of water by weight of the composition.

23. The method of claim 1, wherein said light polymerizable first component comprises a (meth)acrylate blocked polyurethane.

24. The method of claim 1, wherein said heating is carried out at a temperature of from 80° C. to 150° C.

* * * * *